(12) United States Patent
Wang et al.

(10) Patent No.: US 7,157,944 B1
(45) Date of Patent: Jan. 2, 2007

(54) DIFFERENTIAL SIGNAL DETECTOR METHODS AND APPARATUS

(75) Inventors: Shoujun Wang, Nepean (CA); Bill Bereza, Nepean (CA); Tad Kwasniewski, Ottawa (CA); Mashkoor Baig, Ottawa (CA); Haitao Mei, Ottawa (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/833,706

(22) Filed: Apr. 27, 2004

(51) Int. Cl.
*G01R 19/00* (2006.01)
(52) U.S. Cl. ...................................................... 327/58
(58) Field of Classification Search ............ 327/51–52, 327/56, 58, 60, 62–65, 68, 70–72, 74–75, 327/77–83, 89–90, 560–563; 330/252–254, 330/277
See application file for complete search history.

(56) References Cited

U.S. PATENT DOCUMENTS

| | | | | |
|---|---|---|---|---|
| 5,210,527 A | * | 5/1993 | Smith et al. ................. | 340/659 |
| 5,416,484 A | * | 5/1995 | Lofstrom ..................... | 341/159 |
| 6,011,436 A | * | 1/2000 | Koike ......................... | 330/253 |
| 6,084,476 A | * | 7/2000 | Hamanishi et al. .......... | 330/255 |
| 6,111,437 A | * | 8/2000 | Patel ........................... | 327/74 |
| 6,359,510 B1 | * | 3/2002 | Ishii et al. ................... | 330/253 |
| 6,617,922 B1 | * | 9/2003 | Kruiskamp .................. | 330/253 |
| 6,693,826 B1 | * | 2/2004 | Black et al. ................. | 365/173 |

OTHER PUBLICATIONS

H. Johnson, "Carrier Detection," EDN, Sep. 4, 2003, p. 22.

* cited by examiner

*Primary Examiner*—My-Trang Nu Ton
(74) *Attorney, Agent, or Firm*—Fish & Neave IP Group of Ropes & Gray LLP; Robert R. Jackson; Chia-Nao La

(57) ABSTRACT

Circuitry and methods allow signal detection based entirely on differential voltage pairs. An incoming differential data signal is processed by separate full-wave rectifiers to extract high and low peak voltage envelopes. The rectifiers utilize negative feedback to ensure accurate envelope detection, and can detect peaks regardless of incoming signal polarity. The extracted envelopes are compared to a differential pair of threshold voltages. If the envelope signals have a smaller voltage difference than that of the threshold signals, the final output of the detector indicates that a loss-of-signal condition has occurred. Fully differential operation makes the detector independent of common-mode voltage, and thus more robust.

13 Claims, 5 Drawing Sheets

DIFFERENTIAL SIGNAL DETECTOR METHODS AND APPARATUS

BACKGROUND OF THE INVENTION

High speed serial ("HSS") data communication is constantly increasing in importance. It permits more efficient pin usage and power consumption than traditional parallel data communication, while preserving or increasing available bandwidth.

The extremely fast data rate associated with HSS communication makes the verification of signal integrity an important concern. The receiving end of a link must know when the sending end has ceased data transmission, either intentionally or as a result of system failure or signal degradation. Thus, effective signal detection is necessary for reliable HSS communication.

One simple solution would be to introduce an extra signal that runs parallel to the transmitted data. This binary signal would indicate whether or not valid data was being sent at a given time. However, this solution wastes valuable interface pins at the edge of a chip, and does not address the situation where data is unintentionally corrupted.

If the data being transmitted is encoded in a conventional binary fashion, with logic 0 represented by ground ("GND") and logic 1 represented by the power supply voltage ("VCC"), then another possibility would be to examine the incoming data for logic 1's. After a certain amount of a time has passed, during which no logic 1's have been received, the receiving circuit can safely conclude that data transmission has ceased. However, this solution will not work if any type of automatic gain control is used. In this case, even after data transmission has stopped, the automatic gain control would amplify the magnitude of the GND voltage being transmitted, so that the received data is nothing more than amplified white noise passing for valid data.

In order to accommodate the use of automatic gain control, one must turn to slightly more complex solutions. Many successful strategies exist, and are often used in combination with each other. For example, the data to be sent can be encoded in a way that will introduce more bits into the transmission stream. Because of the added redundancy, random errors in the data will tend to violate the coding rules. Thus, if the receiver detects many violations in succession, it can reasonably assume that transmission has ceased.

Another common solution, and the one most relevant to this invention, relies on voltage envelope detection. It extracts a slowly varying envelope based on the peak-to-peak amplitude of the received signal. If the voltage level of the envelope is less than a certain pre-determined threshold, the receiver concludes that the transmitter has gone down.

Existing signal detectors employing envelope detection are typically common-mode dependent, making them less robust. Different hardware vendors may use slightly different VCC voltages to indicate a logical high, so it is difficult to design circuitry that can accommodate all vendors. In addition, absolute voltages are difficult to set precisely, which makes tasks like fixing a reliable threshold voltage more difficult.

In view of the foregoing, it would be desirable to provide more robust circuitry and methods for signal detection that are independent of common-mode voltage.

SUMMARY OF THE INVENTION

In accordance with this invention, circuitry and methods are provided for a fully differential signal detector where feedback is used for accurate envelope detection. An exemplary embodiment of the invention comprises circuitry that accepts two pairs of differential voltage inputs. The first pair, whose component signals are referred to as VIP and VIN, represent the incoming data whose strength is to be determined. The second pair, whose signals are referred to as VTP and VIN, establish a differential threshold to be used as a reference. The circuitry produces one output signal VOUT. When the voltage difference between VIP and VIN is determined to be less than the difference between VTP and VTN, the circuitry outputs a logical low on the output signal VOUT, indicating that a loss-of-signal condition has occurred.

The embodiment described above includes three modules. Two full-wave rectifiers detect the high and low peak voltages of the data represented by VIP and VIN, producing respective positive and negative envelopes that vary slowly in time, referred to as VEP and VEN. The envelopes are processed by a differential difference amplifier, which also accepts threshold voltages VTP and VTN as inputs. This amplifier compares the voltage spread of VEP and VEN to the spread of VTP and VTN, outputting a logical 1 if VEP−VEN is greater than VTP−VTN and a logical 0 if VEP−VEN is less than VTP−VTN.

The invention therefore advantageously compares the strength of an incoming data signal to a reference threshold without relying on common-mode voltage, and indicates whether or not a loss-of-signal condition has occurred.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
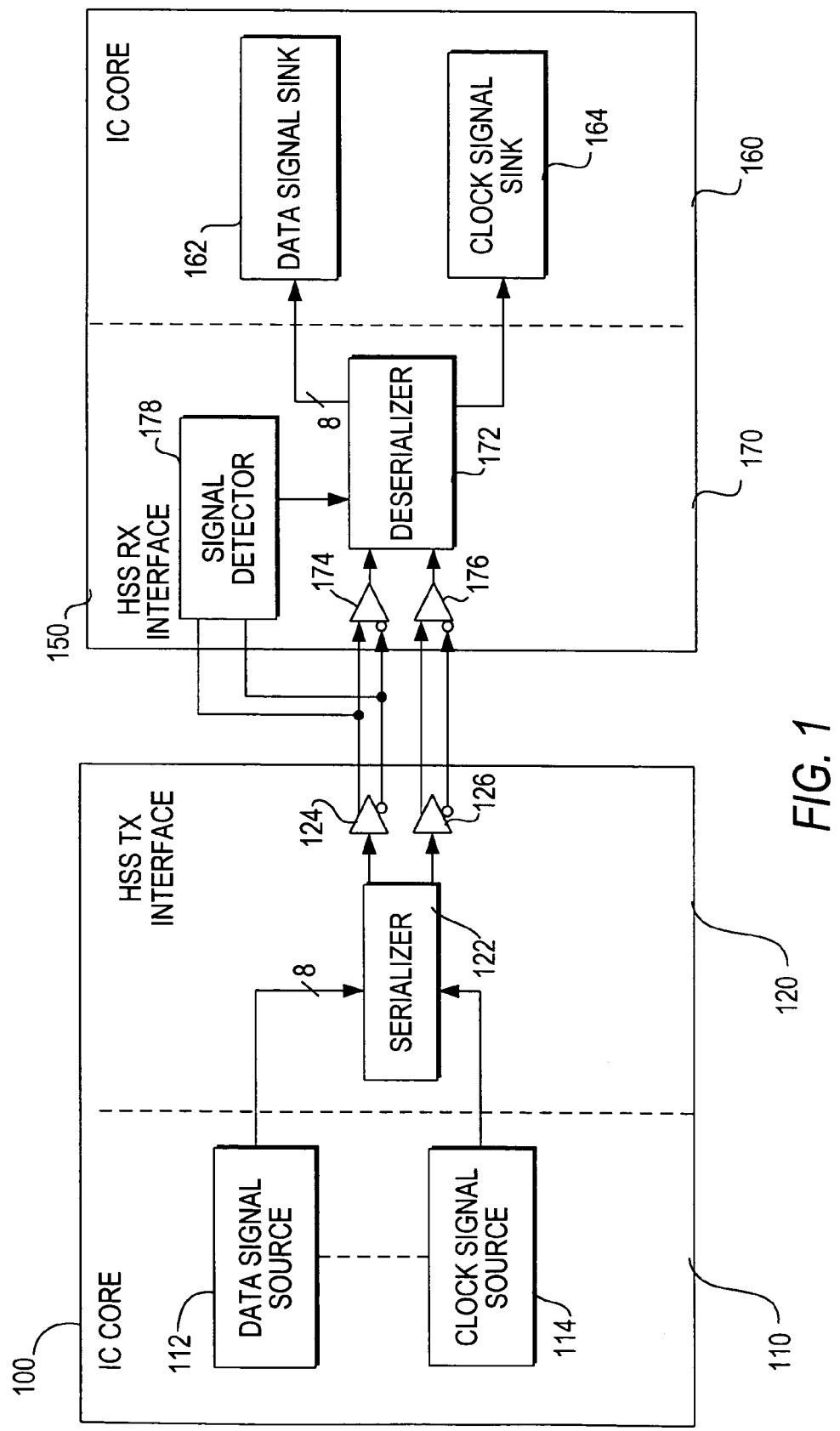
FIG. 1 is a system diagram of a high-speed serial communication system with signal detection.

Two integrated circuit ("IC") chips 100 and 150 that communicate via a high speed serial interface are shown in FIG. 1. Because all elements of transmitting IC 100 have analogous elements in IC 150 that perform the reverse function, corresponding elements are referred to by numbers that differ by 50. Although the interface is shown as occurring between two different ICs, it could also be used for communication within a single IC. Furthermore, the ICs can be of various types, such as programmable logic devices, application-specific integrated circuits, or hybrids of the two.

IC 100 comprises an IC core 110 and a HSS transmission interface 120. IC core 110 contains data signal source 112 and clock signal source 114. Element 112 generates 8-bit bytes to be ultimately transmitted to IC 150. Element 114 generates a clock signal that is associated with the data signal from element 112. The dotted line connecting data signal source 112 and clock signal source 114 indicates a precise frequency relationship between the output signals of the two modules.

Serializer 122 converts the 8-bit parallel data from data signal source 112 into a one-bit data stream that is sent to differential signaling driver 124. Serializer 122 also generates a clock signal associated with the newly formed serial data. This clock signal is sent to differential signaling driver 126. Signaling drivers 124 and 126 each convert a single-ended input signal into a differential pair of output signals, which are then sent to IC 150.

IC 150 receives the serial data and associated clock signal from IC 100. It comprises a HSS receiver interface 170 and an IC core 160. The differential data and clock signals are received by differential receivers 174 and 176, respectively, which convert the differential pairs to single-ended outputs. The differential data signals are also processed by signal detector 178. Element 178 uses a signal detection technique, such as envelope detection, to determine whether or not the incoming data is valid. After it decides whether or not the data is valid, it communicates this decision to deserializer 172.

Deserializer 172 receives the output of signal detector 178, as well as the single-ended signals generated by receivers 174 and 176. If signal detector 178 indicates that data of acceptable integrity is being transmitted, element 172 will convert the serial data generated by receiver 174 into a parallel 8-bit stream, relying on the clock signal from receiver 176 (possibly with an appropriate phase adjustment) to sample bits at appropriate intervals. The 8-bit data is then sent to data signal sink 162, and a related clock signal is sent to clock signal sink 164. Both sinks reside in IC core 160.

It should be noted that the transmission of separate data and clock signals described above assumes that source-synchronous operation is possible. In practice, however, HSS communication can introduce such a large skew between the data and clock signals that the clock must be embedded in the serial data itself. In this case, clock data recovery circuitry would be used to extract the appropriate clock signal at IC 150.

Figure 2:
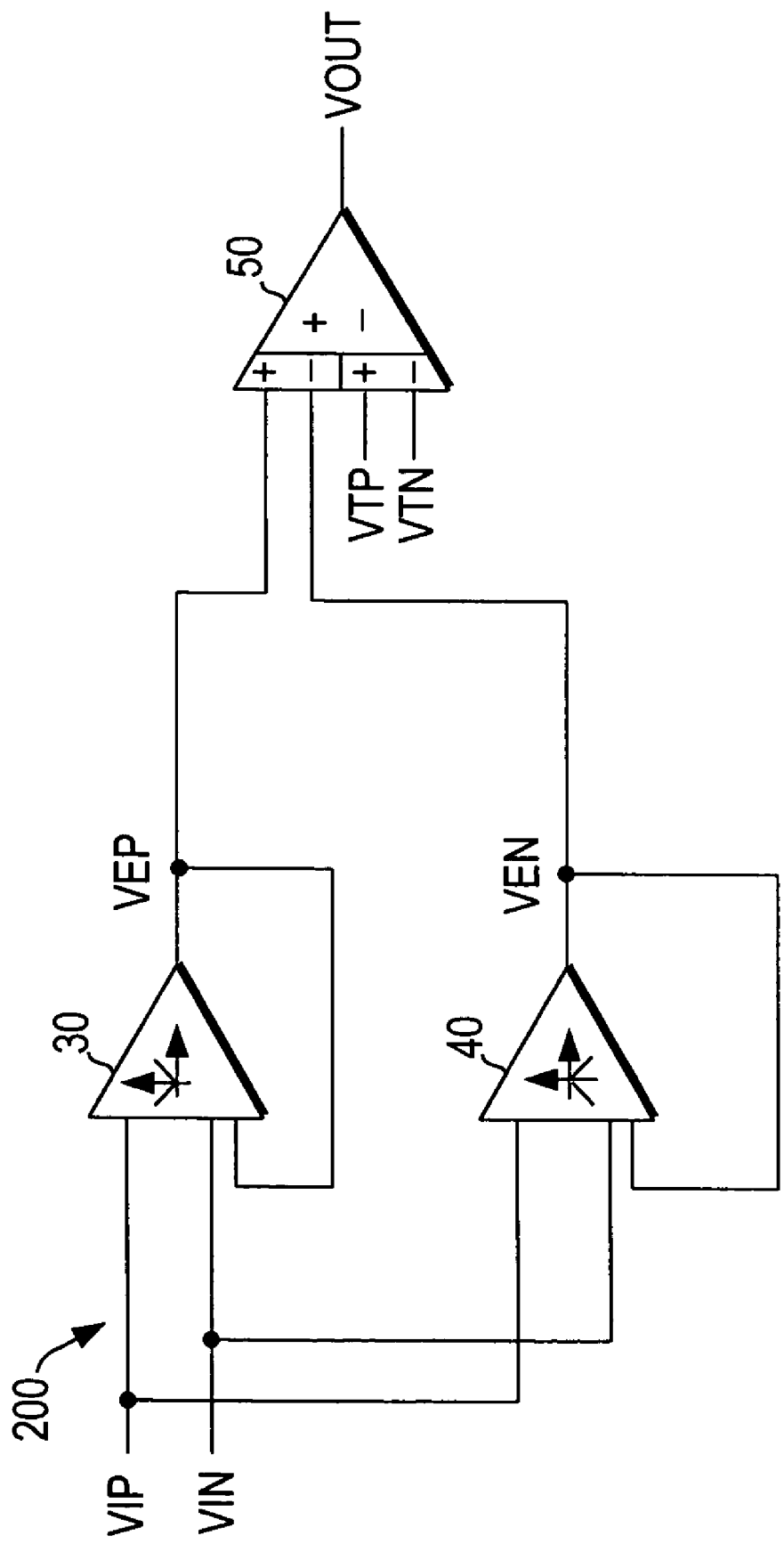
FIG. 2 is a block diagram of a differential signal detector in accordance with the invention.

An illustrative embodiment of signal detector 178 according to the invention is shown in FIG. 2. It comprises full-wave rectifiers 30 and 40, as well as differential difference amplifier 50.

Full-wave rectifier 30 accepts differential data signals VIP and VIN as input. It detects the high peak voltage of the input signal and generates output voltage envelope VEP. VEP is sent to differential difference amplifier 50, as well as back to rectifier 30 in a negative feedback loop. Similarly, full-wave rectifier 40 accepts VIP and VIN as input, detects the low peak voltage of the input signal, and generates envelope VEN as output. VEN is sent to differential difference amplifier 50, and is used by rectifier 40 for negative feedback.

Differential difference amplifier 50 accepts voltage envelope signals VEP and VEN as input. It also accepts reference threshold voltages VTP and VTN. It amplifies the difference between the quantity VEP–VEN and the quantity VTP–VTN, effectively serving as a comparator circuit. Its output signal VO is substantially close to VCC if VEP–VEN is greater than VTP–VTN, and close to GND if VEP–VEN is less than VTP–VTN.

Figure 3:
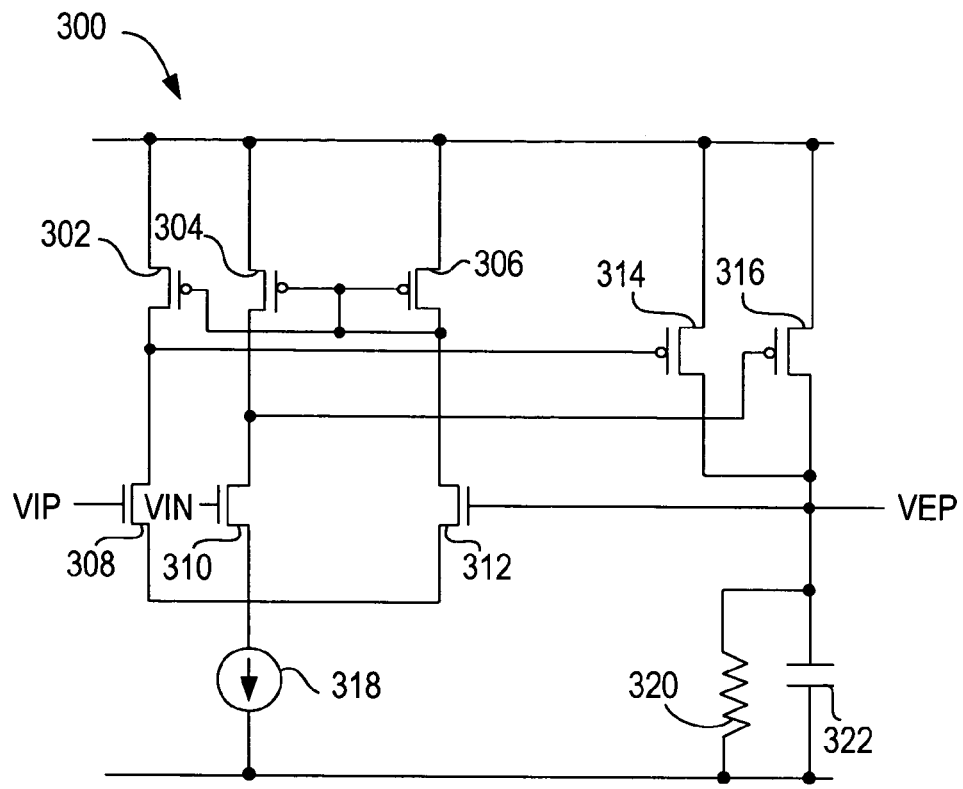
FIG. 3 is a circuit diagram of a full-wave rectifier that detects high peak voltage in accordance with the invention.

An illustrative embodiment of full-wave rectifier 30 is shown in FIG. 3. The differential voltage inputs VIP and VIN are applied to the gates of NMOS transistors 308 and 310, respectively. The output voltage VEP is simply the voltage of capacitor 322, and is determined by how much charge is stored on that capacitor at any given time. This charge is dissipated by current flowing through resistor 320. The capacitance of capacitor 322 is set to be fairly large, in order to ensure a large RC time constant and thus a slowly varying output voltage VEP. It is this slow variation that permits the detection of a peak-to-peak voltage envelope. In other words, changes in the input voltages VIP and VIN are not immediately reflected at VEP. It takes a sustained change in VIP and VIN to effect a noticeable change in the voltage of capacitor 322. Acting against the discharge current passing through resistor 320 is the charging current that flows through PMOS transistors 314 and 316. The current through these transistors is controlled by the left hand side of circuit 300, which is described below.

The left hand side of circuit 300 includes three current branches, converging into current sink 318. PMOS transistors 302, 304, and 306 are joined in a diode connection, which is analogous to a traditional current mirror. The gates of NMOS transistors 308, 310, and 312 are connected to voltage signals VIP, VIN, and VEP respectively. Note that applying voltage VEP to transistor 312 provides a feedback mechanism for the circuit.

Circuit 300 forces VEP to track the high-peak voltage appearing on inputs VIP and VIN. VIP and VIN form a differential pair of voltage inputs and thus have opposite polarity. VEP tracks the value of the positive voltage, regardless of whether it is present on VIP or VIN.

There are three possible operating scenarios for this circuit: VEP can either be less than, equal to, or greater than the actual value of the high peak voltage. For the purpose of illustration, consider the case where VEP is less than the high peak voltage. Also, assume that VIP is carrying a positive voltage while VIN is negative.

Under the conditions described above, transistor 308 will be on and transistor 310 will be off. Since VEP is intended to approximate the high peak voltage, assume that it already has a sufficiently high voltage to activate transistor 312. Thus, current is flowing through two of the three branches connected to current sink 318. The diode connection of transistors 302, 304, and 306 ensures that the current through the two conducting branches is equal.

Recall that VEP is assumed to be less than the high peak voltage, implying that VEP is less than the current value of VIP. The relatively high value of VIP will induce a strong negative charge in the drain of NMOS transistor 308, forcing the drain voltage to drift downwards. Since this drain voltage is connected to the gate of PMOS transistor 314, the current flowing through transistor 314 will increase, causing more charge to flow into capacitor 322. Voltage VEP will continue to increase in this fashion until VEP is substantially equal to VIP, at which point the charging current flowing into capacitor 322 will be approximately equal to the discharge current flowing out of capacitor 322. VEP will then be in a steady state, and will maintain its voltage level until the next change in VIP and VIN.

The preceding description illustrates the operation of circuit 300 when VEP is less than the high peak voltage. Using similar reasoning, one can infer that when VEP is greater than the high peak voltage, the low value of VIP will drive transistor 308's drain voltage up, decreasing the current through transistor 314 and driving VEP down to VIP. As before, when VEP is substantially equal to VIP, VEP will remain in a steady state until the input voltages change. Thus, assuming that VIP reflects the high peak voltage of the incoming signal, VEP will track that voltage regardless of how their initial values compare.

Two features of this circuit are especially noteworthy. First, since the inputs VIP and VIN are used in exactly the same fashion (i.e., their electrical connections are effectively identical), the circuit is capable of detecting high peak voltage regardless of whether it appears on VIP or VIN. If the two scenarios illustrated above were modified so that VIP were negative and VIN were positive, the output voltage VEP would still change to reflect the correct positive voltage. The circuit detects high peak voltage regardless of whether the incoming differential data signal has a positive or a negative voltage difference, making the rectifier truly full-wave. The second point worth noting is that the output signal VEP participates in a negative feedback loop to accurately force VEP to the high peak voltage level.

Figure 4:
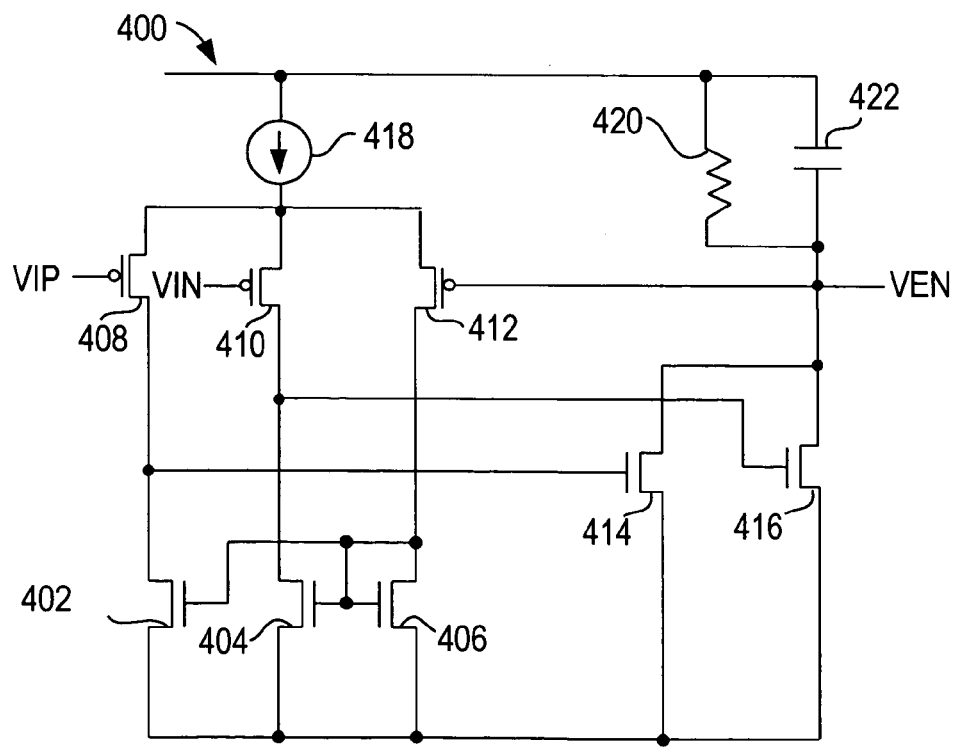
FIG. 4 is a circuit diagram of a full-wave rectifier that detects low peak voltage in accordance with the invention.

FIG. 4 shows an illustrative embodiment of full-wave rectifier 40 of FIG. 2. Circuit 400 is conceptually similar to the circuit shown in FIG. 3, except that it is designed to detect the low peak voltage of VIP and VIN instead of the high peak voltage. Accordingly, circuit 400's topology is the mirror image of circuit 300's, and the elements are reversed in polarity where appropriate. The operation of circuit 400 is so similar to that of circuit 300 that it is not believed necessary to describe FIG. 4 in full detail. Analogous elements in FIGS. 3 and 4 have reference numbers that differ by 100.

Figure 5:
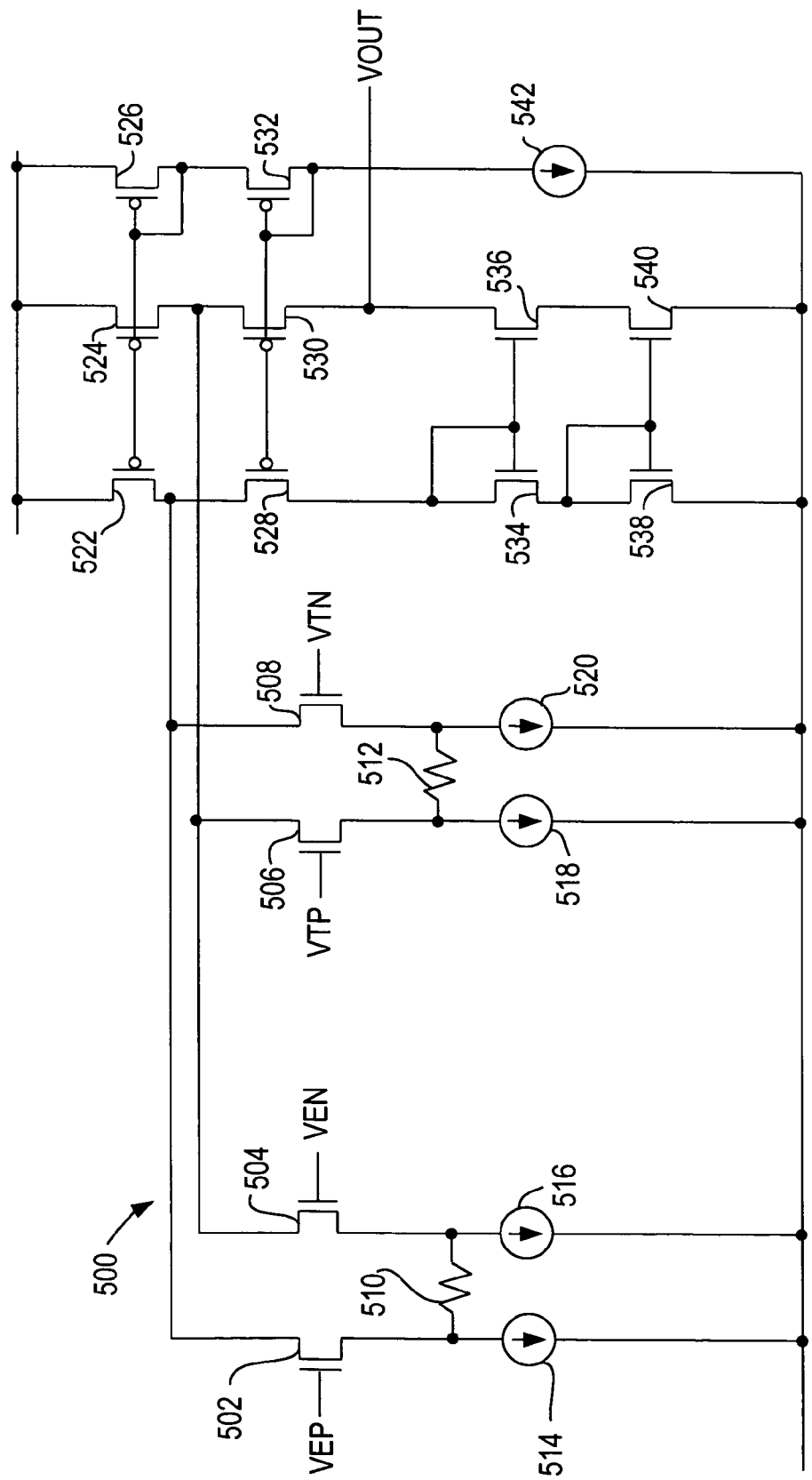
FIG. 5 is a circuit diagram of a differential difference amplifier in accordance with the invention.

FIG. 5 shows a folded cascode differential difference amplifier circuit 500, which is an illustrative embodiment of circuit 50 from FIG. 2. This circuit accepts four input signals, namely envelopes VEP and VEN, and threshold voltages VTP and VTN. It generates one output VOUT.

The envelope voltages VEP and VEN detected in circuits 300 and 400 are connected to the gates of NMOS transistors 502 and 504, respectively. Current sinks 514 and 516 are attached to the sources of transistors 502 and 504, respectively. Resistor 510 connects the two sources to each other.

Threshold voltages VTP and VTN are received in a similar fashion to that of VEP and VEN. VTP and VTN are connected to the gates of PMOS transistors 506 and 508, respectively. The sources of these transistors are attached to current sinks 518 and 510, respectively. Resistor 512 connects the two sources to each other.

The purpose of circuit 500 is to amplify the difference between VEP–VEN and VTP–VTN within the voltage range defined by VCC and GND. Output signal VOUT is pushed close to VCC if VEP–VEN is greater than VTP–VTN, and close to GND if VEP–VEN is less than VTP–VTN. If VEP–VEN happens to be substantially equal to VTP–VTN, the output VOUT will be close to VCC/2.

The four branches on the left containing transistors 502, 504, 506, and 508 perform the differential difference operation. Resistors 510 and 512 increase the range of linear operation for the transistors, which contributes to effective voltage amplification. The cluster of PMOS transistors in the upper right corner, consisting of transistors 522, 524, 526, 528, 530, and 532, serve as a traditional current mirror load. The configuration of NMOS transistors 534, 536, 538, and 540 converts a double-ended differential voltage input to a single-ended output, while current source 542 provides biasing.

Since the ability to set VTP-VTN accurately is important to the operation of the signal detector, the process of setting this voltage difference merits some discussion. It is known that an accurate voltage difference can be achieved by running a pre-determined current through a resistor with known resistance. However, an on-chip resistor will often have some variation in its resistance value, making it unreliable. This obstacle is worked around by observing that two different resistors on the same chip will usually be subject to the same variation. That is, the resistors will vary from their individual target resistances by the same amount. Thus, the ratio of two such resistances can be fixed precisely.

Taking advantage of the idea described above, the voltage difference between VTP and VTN can be obtained as follows. First, an absolute bandgap voltage VBG is set using the relative sizing of two devices. VBG is then applied across an on-chip resistor with resistance R1, yielding a current with value VBG/R1 that tracks' the variation in R1. The tracking current is then passed through a second resistor R2, yielding a final voltage of (VBG/R1)*R2. Because R2 and R1 differ from their respective target values by the same amount, their individual inaccuracies will cancel out. The final voltage (VBG/R1)*R2 will therefore be substantially accurate, and can be applied across VTP and VTN. The ability to precisely define voltage differences is a key advantage to using differential mode signal detection. The voltage difference VTP–VTN can even be made programmable, and set to different values depending on the needs of the application at hand.

Figure 6:
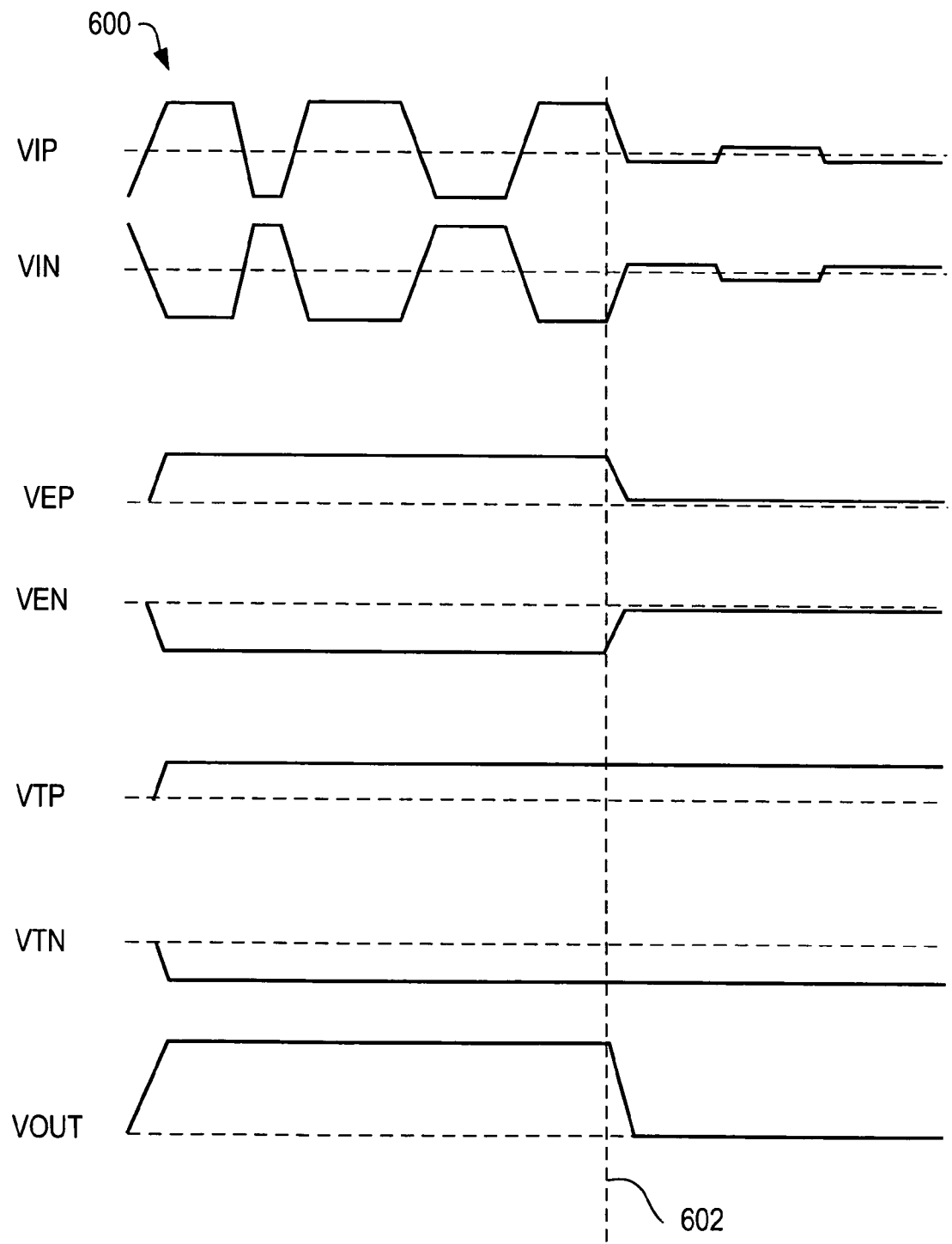
FIG. 6 is a signal diagram showing illustrative voltage signals at various points in the invention.

FIG. 6 shows how signal detector 200 processes an illustrative set of input signals. Initially, VIP and VIN have a large voltage spread, which is reflected by the envelope signals VEP and VEN. In particular, VEP–VEN is greater than VTP–VTN. Accordingly, the output of differential difference amplifier 50, signal VOUT, is close to VCC. This value indicates that data transmission is occurring successfully.

However, at time 602, the strength of differential signals VIP and VIN decreases dramatically due to a disconnection, loss of power at the transmitter, or a similar cause. The envelope voltages VEP and VEN decrease substantially to reflect this change. After VEP–VEN becomes less than VTP–VTN, the output of the differential difference amplifier, signal VOUT, will be driven close to GND. This value indicates that data transmission has ceased.

Note that all the figures described above are merely illustrative. Other embodiments could be used as well. For example, the usage of the signal detector shown in FIG. 1 could vary widely. The transmitted data could be encoded in a way that introduces extra bits into the data stream, allowing the receiving IC to check for transmission errors by detecting coding violations. In this scenario, both the signal detector and the decoding module would be used to decide whether or not transmission had ceased. The transmitted data could also be encoded in a fashion that guaranteed many low-to-high and high-to-low transitions, so that the clock frequency could be extracted by the receiver. In this case, the signal detector would not only be important in receiving transmitted data, but also in determining whether or not the clock signal could be determined reliably.

The circuits shown in FIGS. 2–5 are illustrative as well. For instance, another comparator circuit could be substituted for differential difference amplifier 50, or the circuit shown could be modified to include common-mode feedback.

Alternatively, if a fully rail-to-rail output signal was desired, signal VOUT could be processed by a chain of inverters to drive its value even closer to VCC or to GND.

FIG. 6 shows inputs VIP and VIN being roughly equal in magnitude but opposite in sign. This need not be the case. For example, one input could be strongly positive while the other is weakly negative. Indeed, one of the key advantages of the invention is the reliance on differential voltage as a metric, not absolute voltages, so that a shift of voltages VIP and VIN by the same amount would not affect operation. Similar reasoning applies to threshold voltages VTP and VTN. Also, the decrease in signal strength occurring at time 602 in FIG. 6 could be due to signal corruption across the transmission link or a similar cause, in which case the weakened signal following that time would be substantially more erratic than the one shown.

Although the invention has been described in the context of high speed serial interfaces, it could be used in the front-end of many different systems requiring signal detection. Alternatively, it could be applied internally within a system to validate signal integrity, or to compare a differential data signal to a differential threshold for any other purpose.

Thus it is seen that circuits and methods are provided for fully differential signal detection. One skilled in the art will appreciate that the invention can be practiced by other than the described embodiments, which are presented for purposes of illustration and not of limitation, and the present invention is limited only by the claims which follow.

We claim:

1. Circuitry for detecting the presence of first and second differential input signals comprising:
    first and second circuitry for respectively detecting high and low envelopes of the input signals; and
    third circuitry for comparing a difference between the high and low envelopes to a difference between high and low reference signals.

2. The circuitry defined in claim 1 wherein the high and low reference signals are selected so that their difference is less than the difference between the high and low envelopes when the input signals are present.

3. The circuitry defined in claim 2 wherein the high and low reference signals are further selected so that their difference is greater than the difference between the high and low envelopes when the input signals are not present.

4. The circuitry defined in claim 1 wherein the first circuitry comprises:
    first level detection circuitry responsive to whichever level of the first and second signals is higher.

5. The circuitry defined in claim 4 wherein the second circuitry comprises:
    second level detection circuitry responsive to whichever level of the first and second signals is lower.

6. The circuitry defined in claim 1 wherein the first circuitry comprises:
    first full wave rectifier circuitry.

7. The circuitry defined in claim 6 wherein the second circuitry comprises:
    second full wave rectifier circuitry.

8. The circuitry defined in claim 1 wherein the third circuitry comprises:
    differential difference amplifier circuitry.

9. A method of detecting the presence of first and second differential input signals comprising:
    detecting a high envelope of the first and second input signals;
    detecting a low envelope of the first and second input signals; and
    comparing a difference between the high and low envelopes to a difference between high and low reference signals.

10. The method defined in claim 9 wherein the high and low reference signals are selected so that their difference is less than the difference between the high and low envelopes when the input signals are present.

11. The method defined in claim 10 wherein the high and low reference signals are further selected so that their difference is greater than the difference between the high and low envelopes when the input signals are not present.

12. The method defined in claim 9 wherein the detecting a high envelope comprises:
    basing the high envelope on whichever of the input signals currently has a higher level.

13. The method defined in claim 12 wherein the detecting a low envelope comprises:
    basing the low envelope on whichever of the input signals currently has a lower level.

* * * * *